United States Patent
Saraswat et al.

[11] Patent Number: 5,250,818
[45] Date of Patent: Oct. 5, 1993

[54] LOW TEMPERATURE GERMANIUM-SILICON ON INSULATOR THIN-FILM TRANSISTOR

[75] Inventors: Krishna C. Saraswat; Tsu-Jae King, both of Santa Clara County, Calif.

[73] Assignee: Board of Trustees of Leland Stanford University, Stanford, Calif.

[21] Appl. No.: 663,092

[22] Filed: Mar. 1, 1991

[51] Int. Cl.⁵ .................. H01L 29/04; H01L 27/108; H01L 29/76; H01L 31/117
[52] U.S. Cl. ........................................ 257/66; 257/70; 257/412; 257/616
[58] Field of Search ............... 357/2, 4, 23.1, 23.7, 357/23.2; 257/66, 70l412, 616

[56] References Cited

U.S. PATENT DOCUMENTS

| | | | |
|---|---|---|---|
| 3,258,663 | 6/1966 | Weimer | 357/23.7 |
| 3,890,632 | 6/1975 | Ham et al. | 357/23.7 |
| 4,502,204 | 3/1985 | Togashi et al. | 357/23.7 |
| 4,581,620 | 4/1986 | Yamazaki et al. | 357/2 |
| 4,673,957 | 6/1987 | Ovshinsky et al. | 357/23.7 |
| 5,057,889 | 10/1991 | Yamada et al. | 357/23.1 |
| 5,101,247 | 3/1992 | Ozturk et al. | 357/23.1 |

Primary Examiner—Rolf Hille
Assistant Examiner—Steven Loke
Attorney, Agent, or Firm—Flehr, Hohbach, Test, Albritton & Herbert

[57] ABSTRACT

MOS transistors are formed in thin films of Ge/Si alloys ($Ge_xSi_{1-x}$). According to the process of the present invention, polycrystalline films of Ge/Si are deposited using commercially-available LPCVD equipment, which in the preferred process uses silane and germane as the sources of Ge and Si. The deposited $Ge_xSi_{1-x}$ films are polycrystalline at temperatures for processing down to as below 400° C., and the films can be doped heavily by ion implantation and annealing at temperatures as low as 600° C. to give high mobility and dopant activation yielding very low resistivity. By carrying out the annealing step in the formation of the thin film transistors in the temperature range of 400° to 500° C., the films provide very large grain size, minimizing the impact of grain boundaries in the polycrystalline films where the thin film transistors are to be formed. As a result, thin film MOS transistors are fabricated at temperatures below 500° C., and as low as 400° C., by using $Ge_xSi_{1-x}$ deposition and doping technology. The resulting transistors have significantly improved electrical characteristics compared to thin film transistors fabricated in silicon films utilizing standard processing techniques.

7 Claims, 10 Drawing Sheets

LOW TEMPERATURE GERMANIUM-SILICON ON INSULATOR THIN-FILM TRANSISTOR

This invention was made with Government support under contract DAAL03-88-C-0011 awarded by the Army Research Office. The Government has certain rights in this invention.

FIELD OF THE INVENTION

The invention relates generally to a new process for fabricating MOS transistors in thin films of $Ge_xSi_{1-x}$. Such MOS transistors which are especially useful for static random access memories or large area display drivers are formed in films of $Ge_xSi_{1-x}$ at low temperatures down to 400° C., and the process time is relatively short.

BACKGROUND OF THE INVENTION

Polycrystalline films of silicon (poly-Si) are used to fabricate MOS transistors for static random access memory (SRAM) and large area display driver applications. Large area displays with resolution above several million pixels will be needed for applications such as high resolution graphics, HDTV, etc. One of the most important areas of this technology is driver circuits. At the moment, the display drivers are fabricated in thin films of polycrystalline or amorphous silicon deposited on an insulating substrate like glass or quartz. Low temperature processing is desirable for display driver applications because then the films can be deposited on substrates which preclude high temperature processing. For SRAMS, the lower temperatures are needed to scale down the device and circuit dimensions. One of the major problems being faced by investigators in this area is that the silicon films deposited by a technique like chemical vapor deposition (CVD) are amorphous below deposition temperatures around 550° C. In order to obtain good polycrystalline films of Si, the deposition has to be done above 600° C. MOS transistors fabricated in amorphous films have very poor properties and hence limited use. Higher temperature processing is thus required to convert amorphous silicon films to polycrystalline. For these reasons, the processing temperatures are limited to above 600° C. to obtain reasonable MOS transistor performance.

Even with poly-silicon films, most of the electrical and physical properties of the thin film transistors made using conventional processing are controlled by grain boundaries. Dopant segregation, carrier trapping, anomalous thermal oxidation, and enhanced dopant diffusion are some of the effects of the grain boundaries which severely limit the opportunity to exploit this technology. In order to minimize the impact of grain boundaries, the major requirement is larger grain size in the film, as well as fabrication steps with low temperatures and short times. These requirements have not been met by polycrystalline silicon thin films.

SUMMARY OF THE INVENTION

It is an object of the present invention to provide for low temperature, short time frame processing in the fabrication of MOS devices.

It is a further objective of the invention to minimize the impact of grain boundaries in thin film transistors by achieving a larger grain size in fabrication steps carried out at low temperatures and short time frames by using $Ge_xSi_{1-x}$ films.

It is another objective of the invention to provide for the formation of MOS thin film transistors where the threshold voltage is easily controlled by forming the gate electrode of the transistors in a $Ge_xSi_{1-x}$ film where the threshold voltage is controlled by varying the Ge content.

Yet another objective of the invention is to form improved source drain junctions for thin film transistors by fabricating them in the polycrystalline films of $Ge_xSi_{1-x}$ used to form such transistors, resulting in annealing temperatures which are significantly reduced and annealing times which could be reduced to but a few seconds.

A further objective of the invention is to provide for improvement in the formation and patterning of $Ge_xSi_{1-x}$ films due to the controllable variation of Ge mole fraction with $GeH_4$ flow rate in the formation of the films.

These and other objectives of the present invention are achieved by formation of MOS transistor in thin films of Ge/Si alloys ($Ge_xSi_{1-x}$). According to the process of the present invention, polycrystalline films of Ge/Si are deposited using commercially-available LPCVD equipment, which in the preferred process uses silane and germane as the sources of Ge and Si. The deposited $Ge_xSi_{1-x}$ films are polycrystalline at temperatures for processing down to as low as 400° C., and the films can be doped heavily by ion implantation and annealing at temperatures below 600° C. to give high mobility and dopant activation yielding very low resistivity. By carrying out the annealing step in the formation of the thin film transistors in the temperature range of 400° to 500° C., the films provide very large grain size, minimizing the impact of grain boundaries in the polycrystalline films where the thin film transistors are to be formed. As a result, thin film MOS transistors are fabricated at temperatures below 500° C., and as low as 400° C., by using $Ge_xSi_{1-x}$ deposition and doping technology. The resulting transistors have significantly improved electrical characteristics compared to thin film transistors fabricated in silicon films utilizing standard processing techniques.

BRIEF DESCRIPTION OF THE DRAWINGS

The invention will be better understood by reference to the following detailed description of a preferred embodiment and tests conducted on the preferred embodiment, and the following figures wherein.

DETAILED DESCRIPTION OF A PREFERRED EMBODIMENT

Figure 1:
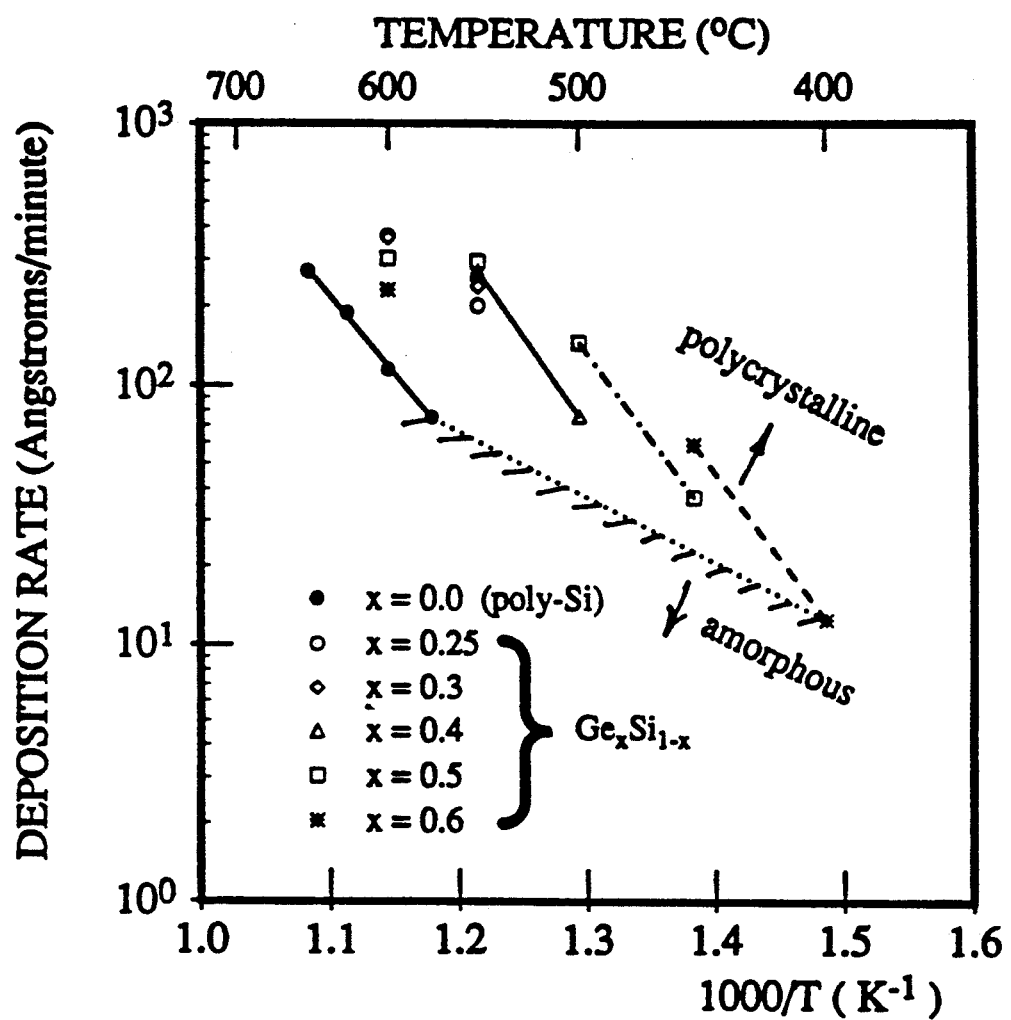
FIG. 1 shows the deposition rate of $Ge_xSi_{1-x}$ and Si films as a function of temperature, and the regimes for polycrystalline and amorphous film deposition.

According to the present invention, MOS transistors of the type shown in FIG. 9 to be discussed in detail below are formed in thin films of germanium/silicon alloys. Experiments conducted to date have shown that the polycrystalline films of Ge/Si can be deposited routinely utilizing commercially-available LPCVD equipment, although other types of equipment may also be useful. Silane and germane were used as the sources of the germanium and silicon. The deposited $Ge_xSi_{1-x}$ films were found to be polycrystalline down to temperatures as low as 400° C. as shown in FIG. 1. This figures illustrates that standard polysilicon films are polycrystalline only if deposited at temperatures down to about 550°, below which they are amorphous. A number of $Ge_xSi_{1-x}$ films have been successfully deposited at temperatures down to 400° C. while remaining polycrystalline as shown in the figure. These films can be doped heavily by ion implantation and annealing at temperatures as low as 500° C. to give high mobility and dopant activation yielding very low resistivity as clearly shown in FIG. 5. The resistivity, as can be seen in the figures, varies both as a function of x in $Ge_xSi_{1-x}$, and as a function of the annealing temperature.

Annealing in the temperature range of 400° to 500° C. produces films with the potential of providing very large grains. Further, the factors reviewed above indicate that low temperature processing of these polycrystalline germanium silicon alloy films is feasible, and that it is possible to fabricate thin film MOS transistors at temperatures below 600° C. Further, the transistor should have much better electrical characteristics than thin film transistors fabricated in silicon films using similar processes, and achieved in a very efficient timeframe. The films on which the tests were conducted, as summarized above, were deposited in a conventional hotwall, tubular reactor using silane ($SiH_4$) and germane ($GeH_4$) as the gaseous deposition sources, with the deposition being carried out in temperature ranges of 400° to 625° C., and at low pressures. As can be seen again from FIG. 1, the deposition rates are significantly higher than those for polysilicon.

Figure 3:
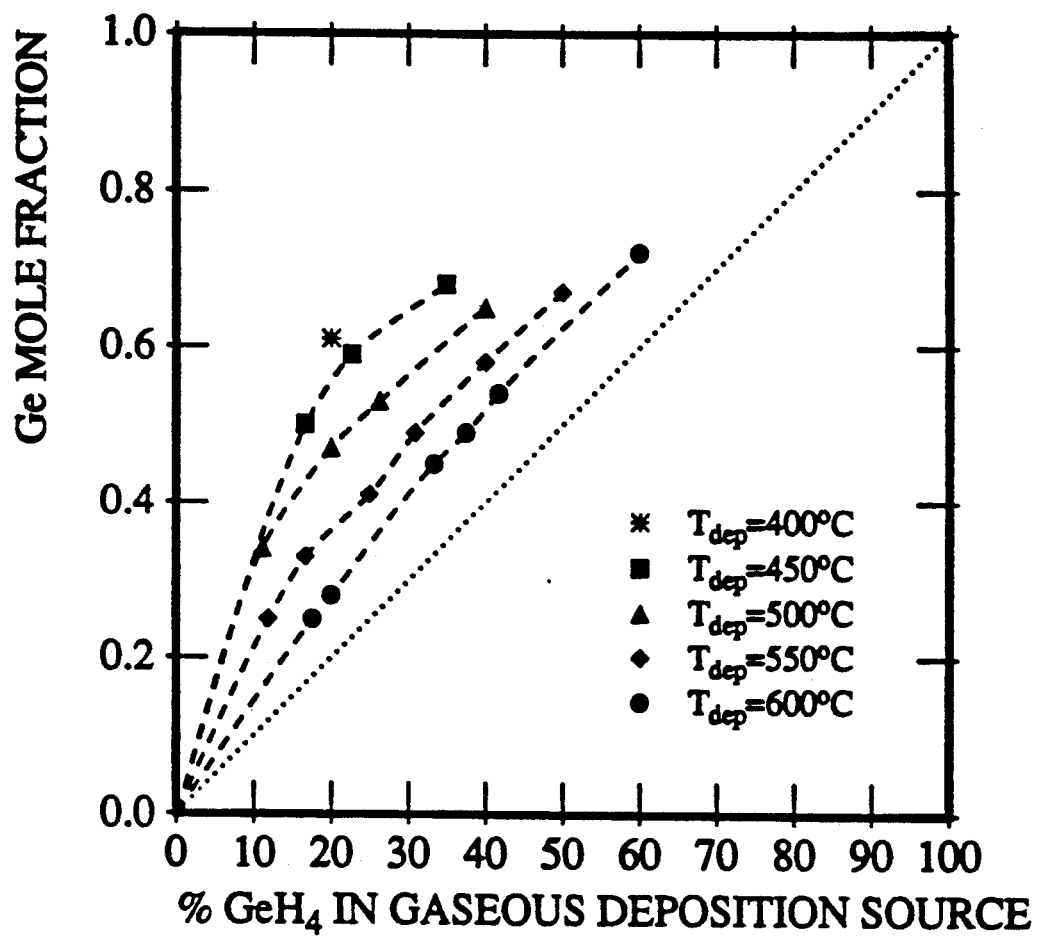
FIG. 3 shows the Ge mole fraction (as determined by X-ray diffraction analysis) vs. $GeH_4$ flow.

Further, referring next to FIG. 3, the percentage of germanium in the deposited films is controllable by varying the percentage of $GeH_4$ in the deposition source gas. It has further been found that the temperature at which the $Ge_xSi_{1-x}$ films deposited are amorphous is a function of the Ge fraction in the film. For example, with 50% Ge (referring again to FIG. 1), the films deposited above 400° C. are polycrystalline, and below that temperature are amorphous. For 25% Ge, the demarcation temperature between polycrystalline and amorphous is about 500° C. In contrast, the silicon films deposited below 550° C. are amorphous.

It has further been found that the Ge/Si films are easily etched using conventional dry etching technology. The practical deposition and the etching rates, combined with the controllable linear variation of Ge mole fraction in the film with $GeH_4$ flow rate make the formation and patterning of poly-$Ge_xSi_{1-x}$ films a very controllable process.

Further, these studies have led to the definition of a product and the outline of an MOS thin film transistor to be discussed below with reference to FIG. 9, which will have highly desirable electrical characteristics, and can be easily and efficiently fabricated.

Figure 2:
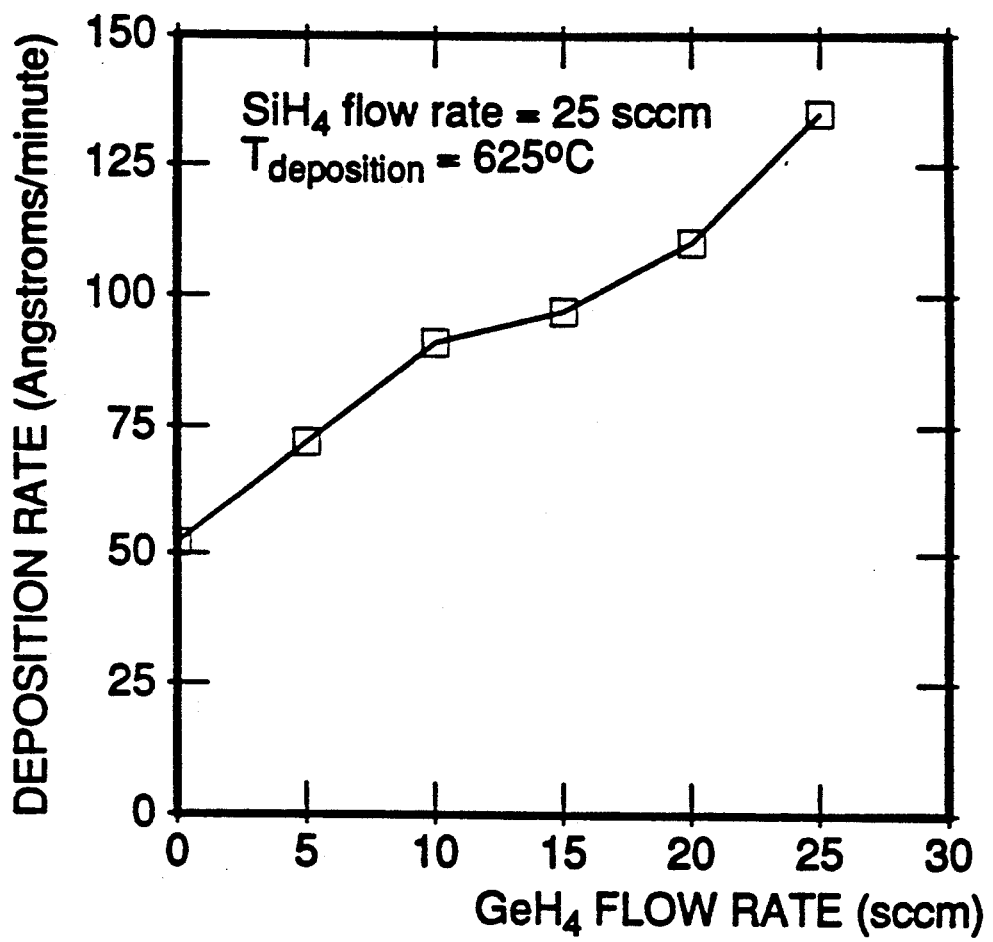
FIG. 2 shows polycrystalline-$Ge_xSi_{1-x}$ film deposition rate as a function of the $GeH_4$ gas flow used during deposition.

This conclusion is further supported by the results shown in FIG. 2 where the film deposition rate of the polycrystalline $Ge_xSi_{1-x}$ film is a function of the germane gas flow rate used during deposition shows that for a constant silane flow rate, the deposition rate is a function of the germane flow rate. This ability to control the film deposition rate is a highly desirable result of the process of this invention.

Figure 4:
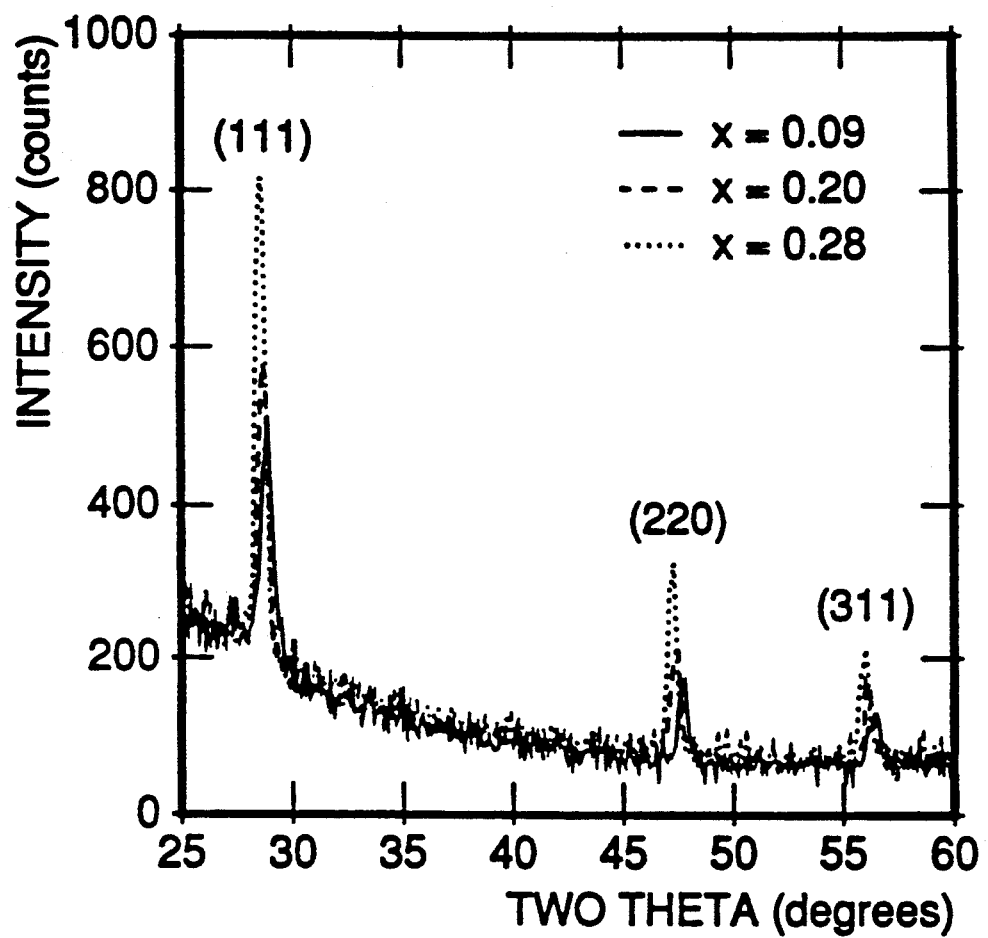
FIG. 4 shows the X-ray diffraction step scans of poly-$Ge_xSi_{1-x}$ films.

The results of all the physical characterization work done to date show that germanium can easily be incorporated into polysilicon to form a $Ge_xSi_{1-x}$ alloy. The thickness and compositional uniformities for deposited poly-$Ge_xSi_{1-x}$ films were as good as those of deposited silicon films. Poly-$Ge_xSi_{1-x}$ films of up to 60% germanium content were not affected by the chemical solutions typically used in silicon processing. Also, the morphology of the films was not changed by high temperature (up to 950° C.) annealing in argon or in oxygen. (See for example FIGS. 4 and 5.) The electrical properties (i.e., resistivity work function) of the poly-$Ge_xSi_{1-x}$ films were found to be very uniform across a wafer. Therefore, it can be concluded that poly-$Ge_xSi_{1-x}$ films are completely compatible with standard VLSI fabrication processes, and the use of poly-$Ge_xSi_{1-x}$ does not add a significant additional process complexity.

Figure 5:
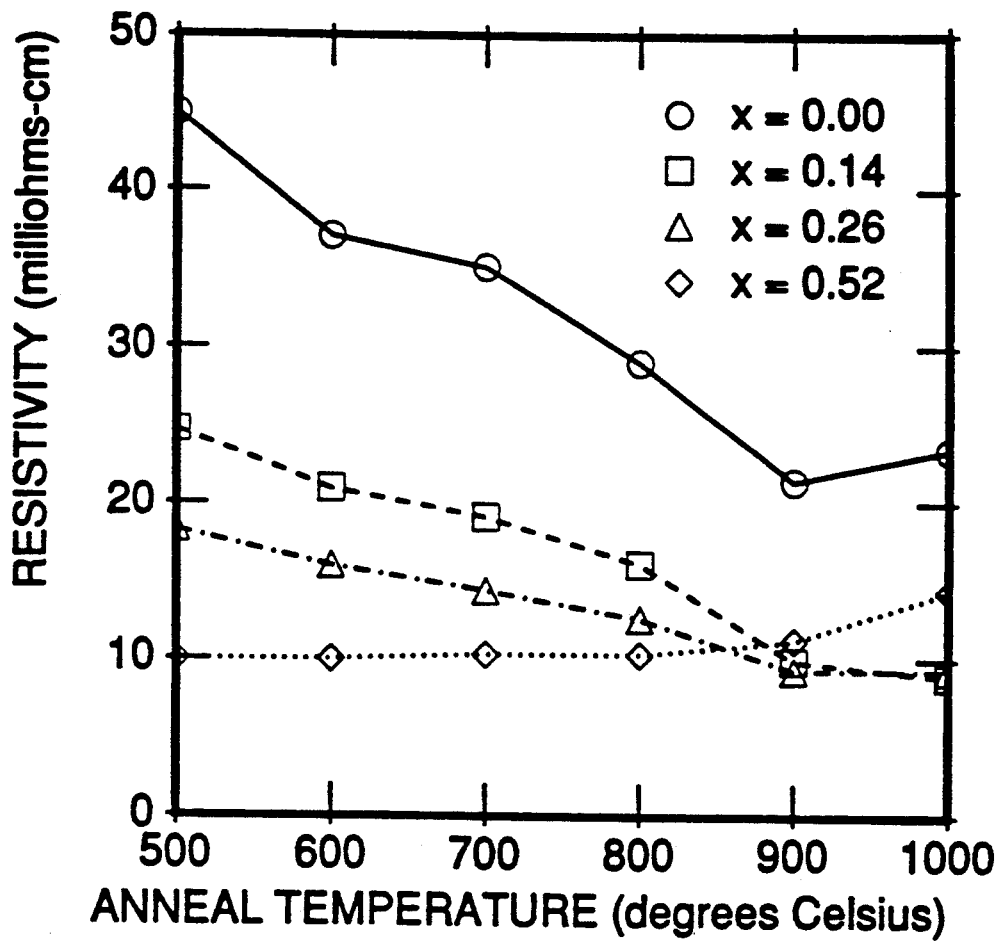
FIG. 5 shows resistivity of poly-$Ge_xSi_{1-x}$ films implanted with $1 \times 10^{15}$ cm$^{-2}$ Boron, then rapid thermal annealed (RTA) for 30 seconds at successively higher temperatures.
Figure 6:
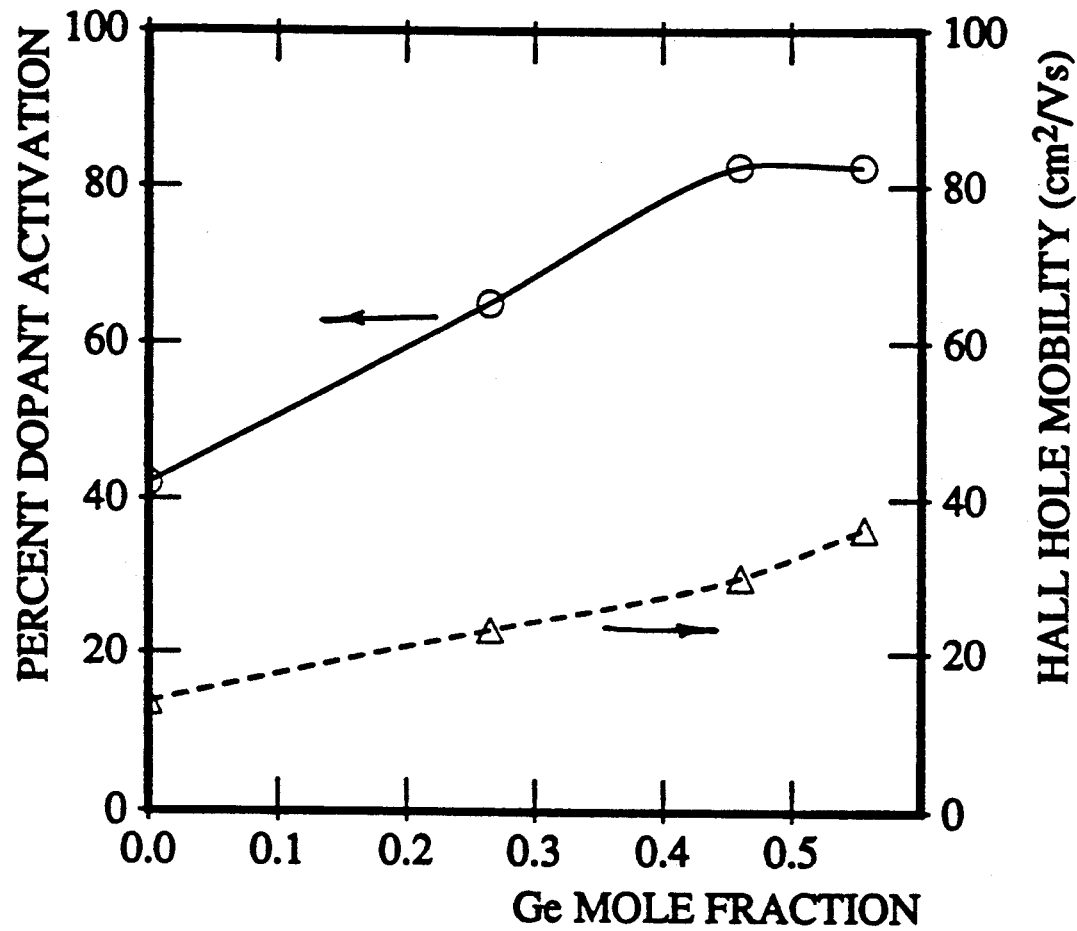
FIG. 6 shows dopant activation (based on Hall measurement of free-carrier concentration) and Hall mobility for poly-$Ge_xSi_{1-x}$ films ion implanted with boron (20 KeV, $4 \times 10^{15}$ cm$^{-2}$) and annealed in Ar at 900° C. for 40 min.

Rapid thermal annealing was used to study the dependencies of film resistivity on anneal temperature and boron implant dose. In this study, approximately 3000 Å thick films were implanted with boron, at an energy of 20 keV, and then annealed for 30 seconds at successively higher temperatures. In FIG. 5, the resistivity is plotted as a function of annealed temperature for films of various Ge content. It is evident that the annealing temperature required to activate the boron decreases dramatically as the Ge content in the film increases. (See FIG. 6.) Hall measurements indicate that the reduction in resistivity with increasing germanium content is the result of a significant increase in dopant activation along with a slight increase in hole mobility (see also FIG. 6). The reduction in annealing temperature down to 500° C. and annealing time down to a few seconds can be extremely important in forming better source drain junctions for thin film transistors (TFTs). In comparison, polycrystalline silicon films of a type already known in the art must be annealed for many hours at temperatures around 600° to 625° C. to achieve meaningful dopant activation. Thus, the use of films $Ge_xSi_{1-x}$ for thin film transistors may mark a significant improvement over all known technology.

Figure 7:
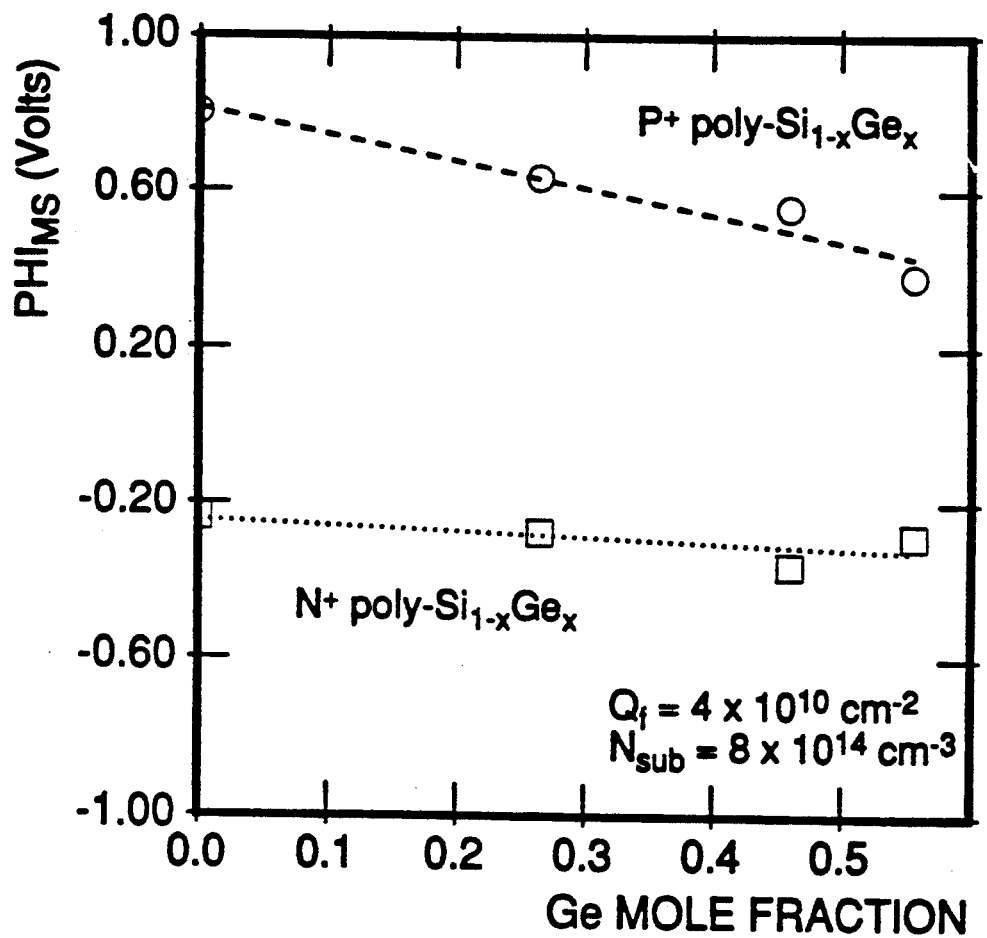
FIG. 7 shows gate-to-semiconductor workfunction difference for poly-$Ge_xSi_{1-x}$ gate PMOS capacitors, extrapolated from measurements of flat band voltage $V_{FB}$ vs. oxide thickness.

MOS capacitors of various gate oxide thicknesses were fabricated on 5-10 ohm-cm n- and p-type substrates using n+ and p+ poly-$Ge_xSi_{1-x}$ films as the gate material. The gate to semiconductor function differences $\phi_{ms}$, was extrapolated from the plots of flatband voltages vs. oxide thickness. The measurement showed that with germanium content increase, a significant decrease in $\phi_{ms}$ for p+ and a slight decrease for the n+ poly-$Ge_xSi_{1-x}$ gate capacitors results as is demonstrated by the work functions plotted in FIG. 7. The well-defined peaks of FIG. 7 and the slight shift in location of the peaks with changes in x also establish the presence of Ge/Si alloys in the film being examined.

Figure 8:
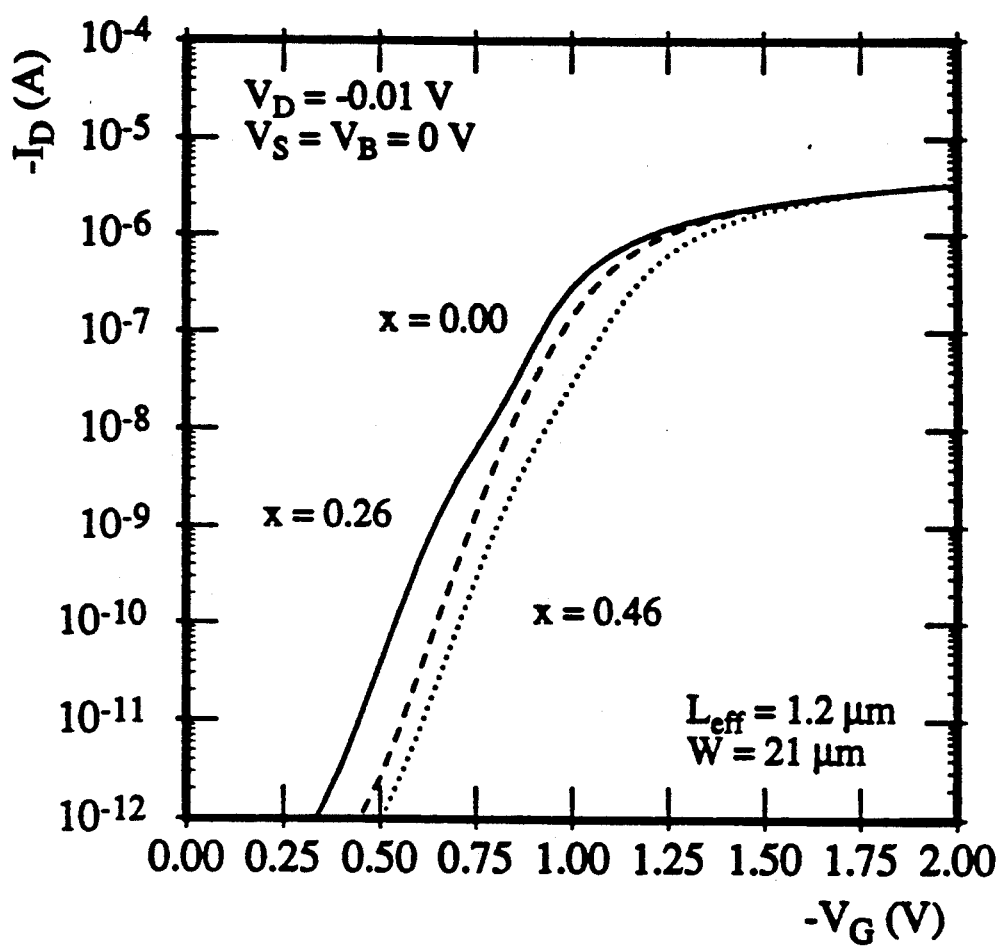
FIG. 8 shows subthreshold drain current ($-I_D$) vs. gate voltage ($-V_G$) characteristics for fabricated PMOS transistors with poly-$Ge_xSi_{1-x}$ gates of various Ge mole fractions.

Simple NMOS and PMOS transistors fabricated using p+ poly-$Ge_xSi_{1-x}$ as the gate material demonstrated shifts in threshold voltage due to the presence of Ge in the gate material. FIG. 8 shows this result for PMOS transistors. Thus, the threshold voltage of MOS thin film transistors (TFTs) could be controlled by varying the germanium content in the p+ poly-$Ge_xSi_{1-x}$ rather than ion implanting the substrate, a difficult process to control due to carrier trapping and dopant segregation at the grain boundaries. Thus, this process yields a further significant advantage in the formation of thin film transistors over approaches known in the technology at this time.

Figure 9:
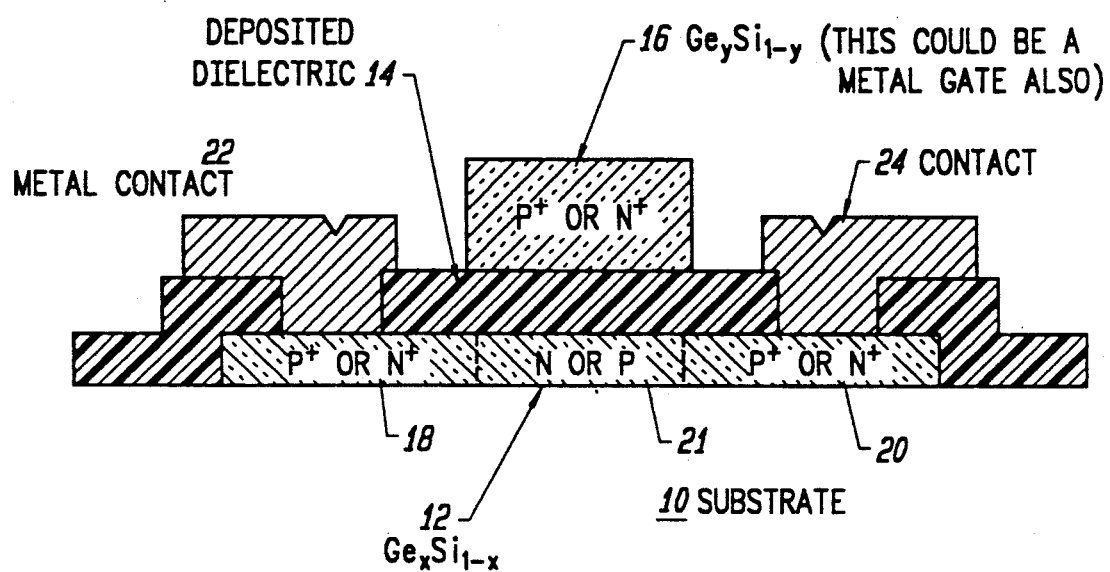
FIG. 9 is a cross-section of a $Ge_xSi_{1-x}$ thin-film transistor.

The following is an example of a typical process sequence that may be used to fabricate the GSOI (germanium silicon alloy on insulator) TFTs shown in FIG. 9.

Starting substrate 10 (e.g. glass)
Poly-$Ge_xSi_{1-x}$ thin film deposition 12 at $\leq 500°$ C.
Grain growth
  for as-deposited amorphous films: low-temperature ($\leq 500°$ C.) anneal
  for as-deposited polycrystalline films:
    pre-amorphization of poly-$Ge_xSi_{1-x}$ film by Si or Ge implantation
    low-temperature ($\leq 500°$ C.) anneal
Implantation for adjustment of threshold voltages
Poly-$Ge_xSi_{1-x}$ island 12 formation
Low-temperature ($\leq 500°$ C.) gate dielectric 14 deposition
  Gate material 16 (e.g. $Ge_xSi_{1-x}$) deposition
  Gate electrode 16 definition
Doping of source 18/drain 20 and gate 16 regions by ion implantation
Low-temperature dielectric deposition
Dopant activation by furnace or rapid thermal lamp anneal (at $\leq 500°$ C.)
  Contact 22, 24 definition
  Metal deposition
  Metal definition
Grain boundary passivation, and anneal—by either of the following methods:
  ion implantation of hydrogen or fluorine, followed by a low-temperature ($\leq 400°$ C.) anneal
  plasma hydrogenation or fluorination Although the example process shows source 18, drain 20 and channel 21 are in the $Ge_xSi_{1-x}$ film, functional devices could be defined as having many advantages of this invention using only a channel region of $Ge_xSi_{1-x}$.

This process also demonstrates that the films disclosed in this application may be used both for the channel region 21 and the gate electrode 16 of a thin film transistor, although the gate electrode 16 could also be successfully made using a metal gate.

Fabrication of MOS TFT's such as shown in FIG. 9 has already been accomplished. Functional devices with excellent device performance were achieved.

Figure 10A:
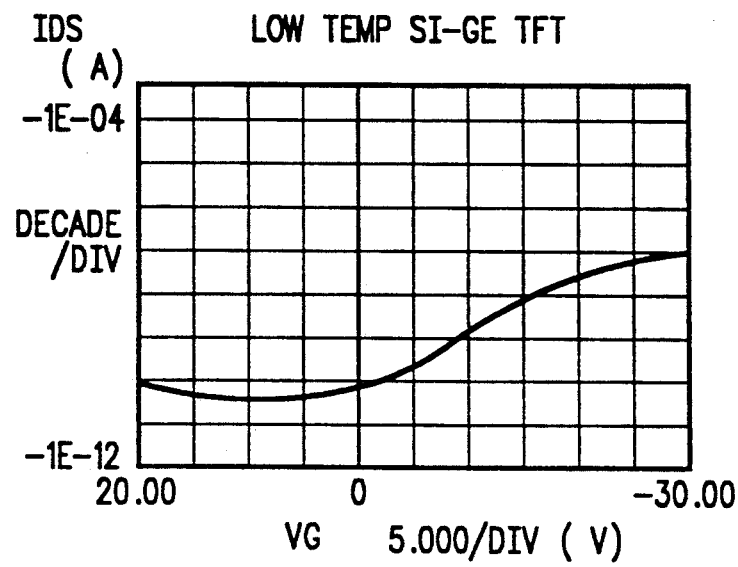
FIGS. 10a and 10b shows the I-V characteristics of a low-temperature processed $Ge_{0.25}Si_{0.75}$ PMOS thin-film transistor.
Figure 10B:
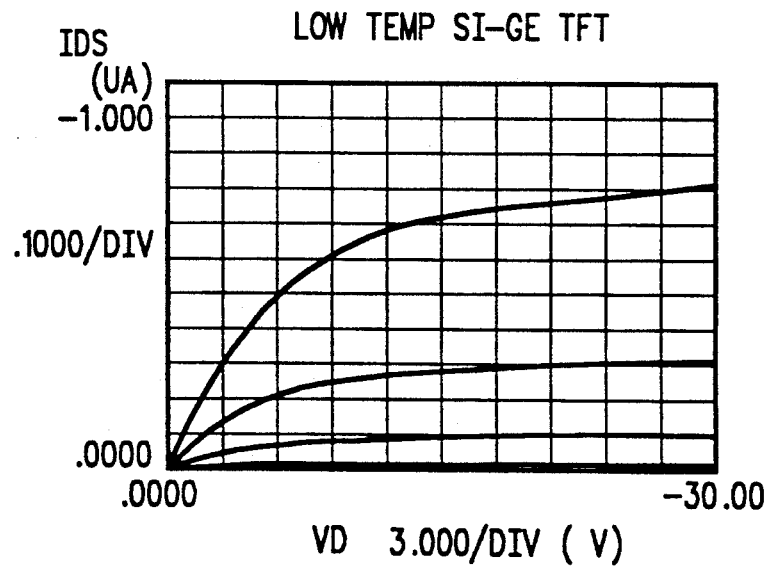

FIGS. 10a and 10b illustrates I-V characteristics of a low-temperature processed $Ge_{0.25}Si_{0.75}$ PMOS thin-film transistor. The source/drain/gate implant was annealed at 550° C. for 30 minutes (channel length=channel width=10 μm). FIG. 10a shows drain current vs. gate voltage; FIG. 10b shows drain current vs. drain voltage for gate voltages 0, −5, −10, −15, −20, and −25 volts.

Other alternatives to the invention disclosed herein may become apparent to a person of skill in the art who studies the invention disclosure. The scope of the invention is to be limited only by the following claims.

What is claimed is:

1. A MOS thin film transistor formed on an insulating substrate comprising a first layer of source and drain regions separated by a channel region,
  contacts to said source and drain region, a gate dielectric overlying said channel region, and
  a conductive gate overlying said gate dielectric and said channel region, wherein said first layer comprising source, drain and channel regions is formed of a polycrystalline $Ge_xSi_{1-x}$ alloy, where $1>x>0$, and wherein said transistor conductive gate is formed of a $Ge_ySi_{1-y}$ alloy, where $1>y>0$.

2. A MOS thin film transistor formed on an insulating substrate comprising a first layer of source and drain regions separated by a channel region,
  contacts to said source and drain region, a gate dielectric overlying said channel region, and
  a conductive gate overlying said gate dielectric and said channel region, said conductive gate being formed of a polycrystalline $Ge_ySi_{1-y}$ alloy, where $1>y>0$.

3. The MOS thin film transistor as claimed in claim 2 wherein the value of y is at least 0.25.

4. The MOS thin film transistor as claimed in claim 2 wherein the value of y is at least 0.5.

5. A MOS thin film transistor formed on an insulating substrate comprising a first layer of source and drain regions separated by a channel region, contacts to said source and drain region, a gate dielectric overlying said channel region, and a conductive gate overlying said gate dielectric and said channel region, wherein said channel region is formed of a polycrystalline $Ge_xSi_{1-x}$ alloy wherein $1>x>0$, said transistor conductive gate being formed of a $Ge_ySi_{1-y}$ alloy, where $1>y>0$.

6. The MOS thin film transistor as claimed in claim 5 wherein the value of y is at least 0.25.

7. The MOS thin film transistor as claimed in claim 5 wherein the value of y is at least 0.5.

* * * * *